(12) United States Patent
Dall'Acqua

(10) Patent No.: US 12,300,954 B2
(45) Date of Patent: May 13, 2025

(54) ELECTRICAL CONNECTION DEVICE WITH IMPERMEABLE MATERIAL

(71) Applicant: JTEKT EUROPE, Irigny (FR)

(72) Inventor: Clément Dall'Acqua, Caluire et Cuire (FR)

(73) Assignee: JTEKT EUROPE, Irigny (FR)

( * ) Notice: Subject to any disclaimer, the term of this patent is extended or adjusted under 35 U.S.C. 154(b) by 357 days.

(21) Appl. No.: 17/780,296

(22) PCT Filed: Dec. 2, 2020

(86) PCT No.: PCT/FR2020/052255
§ 371 (c)(1),
(2) Date: May 26, 2022

(87) PCT Pub. No.: WO2021/111079
PCT Pub. Date: Jun. 10, 2021

(65) Prior Publication Data
US 2023/0030986 A1 Feb. 2, 2023

(30) Foreign Application Priority Data
Dec. 3, 2019 (FR) ...................................... 19/13648

(51) Int. Cl.
*H01R 4/70* (2006.01)
*B60R 16/02* (2006.01)
(Continued)

(52) U.S. Cl.
CPC ............... *H01R 4/70* (2013.01); *B60R 16/02* (2013.01); *H01R 13/5216* (2013.01); *H05K 5/065* (2013.01); *H01R 2201/26* (2013.01)

(58) Field of Classification Search
CPC .. H01R 13/5216; H01R 2201/26; H01R 4/70; B60R 16/02; H05K 5/064; H05K 5/065
(Continued)

(56) References Cited

U.S. PATENT DOCUMENTS 3,079,580 A * 2/1963 Paasche .................. H01R 13/53
439/367
3,744,128 A * 7/1973 Fisher ................ H01R 13/6599
174/75 C
(Continued)

FOREIGN PATENT DOCUMENTS

CN 108808618 A * 11/2018 ............. H02G 15/23
DE 102014007443 A1 * 11/2015 ............. B60R 16/02
(Continued)

OTHER PUBLICATIONS

Feb. 12, 2021 Search Report issued in International Patent Application No. PCT/FR2020/052255.

*Primary Examiner* — Marcus E Harcum
(74) *Attorney, Agent, or Firm* — Oliff PLC

(57) ABSTRACT

The connection device for connecting two electric units, including a case in which are arranged: an electric wire to be linked to the first unit and including a conductive core encircled by an insulating sheath and a conductive tab to be linked to the second unit and secured with the stripped end of the conductive core, all of which being immersed in a sealing material filling the case and bonded to the insulating sheath, the device including an intermediate envelope partially coating the insulating sheath, so that it is in contact with the sealing material only over a reduced portion, where the intermediate envelope is in sliding contact with the sealing material and/or the insulating sheath.

10 Claims, 3 Drawing Sheets

(51) Int. Cl.
*H01R 13/52* (2006.01)
*H05K 5/06* (2006.01)

(58) Field of Classification Search
USPC .................................. 439/276, 275, 936
See application file for complete search history.

(56) References Cited

U.S. PATENT DOCUMENTS

| | | | | |
|---|---|---|---|---|
| 3,816,641 | A * | 6/1974 | Iversen | H01R 13/523 |
| | | | | 174/76 |
| 3,999,830 | A * | 12/1976 | Herrmann, Jr. | H01R 13/518 |
| | | | | 439/906 |
| 4,335,932 | A * | 6/1982 | Herrmann, Jr. | H01R 43/24 |
| | | | | 174/541 |
| 4,425,017 | A * | 1/1984 | Chan | H01R 13/523 |
| | | | | 439/201 |
| 4,515,345 | A * | 5/1985 | Inden | F16K 31/0658 |
| | | | | 335/260 |
| 4,679,875 | A * | 7/1987 | Ramsey | H01R 13/523 |
| | | | | 439/604 |
| 5,080,614 | A * | 1/1992 | Utgaren | H01R 24/30 |
| | | | | 439/695 |
| 5,518,415 | A * | 5/1996 | Sano | H01R 13/521 |
| | | | | 439/204 |
| 5,637,007 | A * | 6/1997 | Suzuki | H01R 13/5216 |
| | | | | 439/936 |
| 6,142,805 | A * | 11/2000 | Gray | H01R 13/5213 |
| | | | | 439/272 |
| 7,025,614 | B2 * | 4/2006 | Herrick | F04C 23/008 |
| | | | | 439/276 |
| 7,390,217 | B2 * | 6/2008 | Scott | G01V 1/201 |
| | | | | 439/604 |
| 7,833,038 | B1 * | 11/2010 | King, Jr. | H01R 4/48185 |
| | | | | 439/936 |
| 7,845,990 | B2 * | 12/2010 | Shrum | H01R 13/5216 |
| | | | | 174/67 |
| 8,187,016 | B2 * | 5/2012 | Vijh | H01R 13/5205 |
| | | | | 439/271 |
| 8,591,243 | B2 * | 11/2013 | Brune | H01R 13/5216 |
| | | | | 439/936 |
| 8,872,025 | B2 * | 10/2014 | Tamai | B62D 5/0406 |
| | | | | 361/728 |
| 8,943,686 | B2 * | 2/2015 | Hartford | H01R 43/005 |
| | | | | 148/400 |
| 9,237,667 | B2 * | 1/2016 | Tamai | H01R 13/5216 |
| 10,123,438 | B1 * | 11/2018 | Sanda | G01V 3/10 |
| 10,334,665 | B2 * | 6/2019 | Kim | H05B 3/44 |
| 10,663,328 | B2 * | 5/2020 | Steinich | G01D 11/26 |
| 2006/0121773 | A1 * | 6/2006 | Ichikawa | H01R 13/5216 |
| | | | | 439/408 |
| 2008/0176425 | A1 * | 7/2008 | Sakakura | H01R 13/5216 |
| | | | | 439/78 |
| 2008/0304200 | A1 * | 12/2008 | Hotchkiss | H05K 3/284 |
| | | | | 361/752 |
| 2009/0017660 | A1 * | 1/2009 | Braganza | H01R 4/22 |
| | | | | 439/276 |
| 2009/0302034 | A1 * | 12/2009 | Makela | H02G 3/088 |
| | | | | 174/152 G |
| 2018/0266851 | A1 * | 9/2018 | Katsura | H03K 17/952 |
| 2018/0299239 | A1 * | 10/2018 | Eitschberger | H05K 5/069 |

FOREIGN PATENT DOCUMENTS

| | | | | |
|---|---|---|---|---|
| EP | | 2 500 986 A2 | 9/2012 | |
| EP | | 2 634 868 A1 | 9/2013 | |
| WO | WO-2014132973 A1 * | 9/2014 | ......... B29C 44/1266 |

* cited by examiner

ELECTRICAL CONNECTION DEVICE WITH IMPERMEABLE MATERIAL

The present invention concerns an electrical connection device, designed to electrically and sealingly connect two electric units.

It also relates to a motor vehicle including such a connection device.

Motor vehicles are commonly equipped with a power steering system to reduce the effort required by the driver thereof to steer it.

This power steering system usually includes an electric assist motor, arranged in an engine compartment of the motor vehicle, piloted by an electronic board, arranged inside a sealed case.

It is known to use connection devices, placed between this assist motor and this electronic board in order to make an electrical connection between these two elements.

It is also known to use such connection devices in order to make an electrical connection between an electronic board of a motor vehicle and the wiring harness of the latter, connecting to said electronic board the various functional assemblies of said motor vehicle.

Moreover, these connection devices are adapted to guarantee the sealing of the electrical connection made between the assist motor and the electronic board or between the electronic board and the harness of the vehicle, so as not to disturb said electrical connection due to the presence of external liquids or gases in the engine compartment of the motor vehicle.

For example, the document EP2500986 describes a connection device including a case in which are arranged electric wires, linked to the assist motor, and electrical connectors, linked to the electronic board.

These electric wires each have an insulating sheath enclosing a conductive core, this conductive core being formed of several copper strands and having a stripped end welded or crimped to an electrical connector, thus making an electrical connection between the assist motor and the electronic board.

The inside of the case is also filled with a sealing resin, embedding the electric wires and the electrical connectors, ensuring the sealing of the electrical connection thus made.

However, once this sealing resin has solidified, it becomes integral with the insulating sheaths of the electric wires: any mechanical deformation of the sealing resin causes deformation of the insulating sheaths.

In particular, when the sealing resin is exposed to significant temperature variations, it tends to expand (in the event of an increase in temperature) or to contract (in the event of a drop in temperature), deforming as a result the insulating sheaths of the electric wires.

This deformation results in a relative displacement of the conductive cores with respect to the insulating sheaths of the electric wires: the conductive cores slide inside the insulating sheaths and are alternately extracted from the insulating sheaths then pushed back therein.

This phenomenon is called «pumping phenomenon D».

The relative movement of the conductive cores with respect to the insulating sheaths may result, in particular in the event of misalignment between these conductive cores and these insulating sheaths, in a twisting of the copper strands constituting the conductive cores leading, over time, to a rupture of the electrical connection between the two electric units connected via the connection device.

The invention aims at solving all or part of this drawback, by providing a device making it possible to guarantee a good electrical connection between two electric units, even after the latter has been exposed to a large number of temperature variations.

Another object of the invention is to provide a connection device which remains simple and inexpensive in design and manufacture.

To this end, it provides a connection device adapted to electrically connect in a sealed manner a first electric unit and a second electric unit, said connection device including a connection case defining an interior space in which are arranged:

at least one electric wire, adapted to be linked to said first electric unit and including a conductive core encircled by an insulating sheath up to a stripped end of said conductive core, and a conductive tab, adapted to be linked to said second electric unit and mechanically secured to the stripped end of said conductive core, so as to make electrical contact between said conductive tab and said conductive core, said conductive tab, said stripped end and said insulating sheath being immersed in a sealing material filling the interior space of the connection case and sealing the electrical connection between said conductive tab and said stripped end, said sealing material being bonded on said insulating sheath and on said connection case, said connection device being characterized in that it includes an intermediate envelope partially coating said insulating sheath, so that said insulating sheath is in contact with said sealing material only over a reduced portion of the insulating sheath, where said insulating sheath is in sliding contact with the sealing material and/or with the insulating sheath.

Such a connection device makes it possible to make an electrical connection between the first electric unit, linked to the electric wire, and the second electric unit, linked to the conductive tab, thanks to setting this conductive tab in contact with the stripped end of the conductive core of the electric wire.

The presence of the sealing material, in which the conductive tab, the stripped end and the insulating sheath are embedded, makes it possible to ensure the sealing of this connection.

The invention suggests to place an interface, formed by the intermediate envelope, between the sealing material and the insulating sheath of the electric wire, so as to reduce the contact surface existing between the sealing material and the insulating sheath and thus to reduce the pumping phenomenon.

However, it should be noted that, to guarantee the sealing of the electrical connection between the first electric unit and the second electric unit, it is necessary for the sealing material to remain in contact with the insulating sheath of the electric wire, but on a reduced contact surface.

The intermediate envelope being in sliding contact either with the sealing material, or with the insulating sheath, or with these two elements, said insulating sheath is no longer mechanically coupled to said sealing material along said intermediate envelope.

Thus, an expansion or a contraction of the sealing material will only lead to a deformation of the insulating sheath of the electric wire at the level of the reduced contact surface existing between this sealing material and this insulating sheath.

In this way, the relative movement between the insulating sheath and the conductive core of the electric wire, caused by the thermal expansion or contraction of the sealing material, is considerably reduced and the risk of twisting or rupture of this conductive core is avoided.

Thanks to the presence of the intermediate envelope enclosing the insulating sheath of the electric wire, the connection case according to the invention guarantees good quality of the electrical connection between the first electric unit and the second electric unit, even in the event of strong variations of temperatures.

In a first embodiment, the sealing material is bonded to the intermediate envelope, said intermediate envelope being slidably mounted on the insulating sheath.

This feature may be achieved, for example, by a specific choice of materials for the insulating sheath and the intermediate envelope, or by a surface treatment of at least one of these elements.

The intermediate envelope is then secured to the sealing material and mechanically coupled thereto: the expansions or contractions of the sealing material lead therefore to deformations of this intermediate envelope, but these deformations are not transmitted to the insulating sheath, due to the sliding contact between these two elements.

The intensity of the mechanical friction between the insulating sheath and the intermediate envelope being very low, this insulating sheath will not undergo any deformation along this intermediate envelope, the intermediate envelope sliding on the insulating sheath without deforming it.

The insulating sheath undergoes therefore no deformation along the intermediate envelope following expansions or contractions of the sealing material.

In a second embodiment, the intermediate envelope is bonded to the insulating sheath and is in sliding contact with the sealing material.

Since the intermediate envelope is not bonded to the sealing material, it is not deformed in the event of expansion or of contraction of the sealing material in the event of an increase or a drop in temperature: the insulating sheath of the electric wire is thus protected against any deformation along the intermediate envelope.

It is also possible for the intermediate envelope to be bonded neither to the insulating sheath nor to the sealing material, and not be mechanically coupled to either of these two elements.

It will also be noted that, when such a connection device is used within a power steering system of a motor vehicle (preferred but non-limiting scope of use of the invention), the first electric unit may correspond to an assist motor or a torque sensor and the second electric unit may correspond to an electronic board adapted to pilot said assist motor or said torque sensor: the connection device according to the invention thus makes it possible to electrically connect in a sealed manner this electronic board to said assist motor or torque sensor.

More generally, the first electric unit may correspond to an electrical harness of a motor vehicle and the second electric unit to an electronic board that may be powered by or communicate with various actuators of such a motor vehicle.

In a third embodiment, the intermediate envelope is bonded neither to the insulating sheath nor to the sealing material and is in sliding contact with both said insulating sheath and the sealing material.

In one embodiment, the intermediate envelope and the insulating sheath are each made of a different material.

According to one possibility, the intermediate envelope is made of a material having a coefficient of thermal expansion lower than that of the sealing material.

When the intermediate envelope is bonded to the insulating sheath, it is indeed advantageous to choose, to produce this intermediate envelope, a material having a low coefficient of thermal expansion, in order to reduce as much as possible the deformations undergone by this intermediate envelope in case of temperature variation: the insulating sheath being in contact with this intermediate envelope, this feature makes it possible to reduce the deformations undergone by the insulating sheath.

In particular, choosing a material having a coefficient of thermal expansion lower than that of the sealing material makes it possible to doubly reduce the deformations undergone by the insulating sheath compared to the connection devices of the state of the art in which the sealing material is directly bonded to this insulating sheath: not only is the sealing material no longer in contact with the insulating sheath due to the presence of the intermediate envelope, but also this intermediate envelope expands (or contracts) less compared to the sealing material.

According to one feature, the intermediate envelope is formed from a foam-like material.

According to another feature, the intermediate envelope is formed by a heat-shrinkable sleeve.

In this way, the assembly of the intermediate envelope on the insulating sheath is greatly simplified because it then suffices to place said intermediate envelope with a play around said insulating sheath: by heating the intermediate envelope, it retracts automatically until it comes into contact with the insulating sheath, due to its heat-shrinkability.

In one embodiment, the electric wire enters the interior space through an orifice formed in a side wall of the connection case, the conductive core, the insulating sheath and the intermediate envelope passing through said side wall through said orifice.

In this embodiment, the insulating sheath is thus never in direct contact with the connection case: in the event of deformation of the latter (for example, under the effect of expansion or contraction of the sealing material in the event of a temperature variation), the insulating sheath will not be affected by this deformation: the deformation of the connection case will therefore not cause any relative movement between the insulating sheath and the conductive core of the electric wire, that could cause twisting of this conductive core.

According to one feature, the conductive core, the electrical sheath and the intermediate envelope extend in a longitudinal direction, parallel to a bottom of the connection case.

Other embodiments are of course possible, in particular depending on the positioning of the connection case relative to the first electric unit and to the second electric unit.

According to one possibility, the intermediate envelope consists of only a single section extending from the side wall of the connection case.

The reduced contact surface at which the sealing material is bonded to the insulating sheath is then located close to the stripped end of the conductive core.

It is also advantageous for this contact surface to be reduced to the minimum required to guarantee good sealing of the electrical connection.

In an equivalent manner, it is advantageous for the intermediate envelope to have a length, measured from the side wall, which is as long as possible.

This feature also makes it possible to guarantee a considerable reduction in the risk of torsion of the conductive core and of degradation of the quality of the electrical connection between the first electric unit and the second electric unit.

According to one possibility, the intermediate envelope has a thickness greater than that of the insulating sheath.

According to one feature, the tab is secured to the connection case and to the conductive core of the electric wire, said connection tab being fastened to said conductive core by welding or crimping.

In this case, the conductive core is secured, via the conductive tab, to the connection case.

In one embodiment, the conductive core of the electric wire is formed by at least two separate copper strands.

The electric wire is then of the «multi-strand» type and is particularly sensitive to the pumping phenomenon, in particular when the set of the strands (also called «stranded wire») constituting the core of the electric wire has a small cross section (for example, less than 0.5 $mm^2$): it is then advantageous to reduce as much as possible the size of the reduced contact surface at the level of which the insulating sheath is bonded to the sealing material, in order to limit the intensity of the pumping phenomenon.

The invention also concerns a motor vehicle control system, said control system including:
  at least one actuator or sensor, for example a steering assist motor,
  an electronic board, configured to pilot said at least one actuator or sensor, and
  a connection device according to any one of the preceding claims, the conductive tab being electrically linked to said electronic board and the electric wire being electrically linked to said at least one actuator or sensor.

When the at least one actuator corresponds to a steering assist motor (or a torque sensor), the control system according to the invention corresponds to a steering assist system for a motor vehicle.

Other features and advantages of the present invention will appear upon reading the detailed description hereinafter of a non-limiting example of implementation, made with reference to the appended figures in which.

Figure 1:
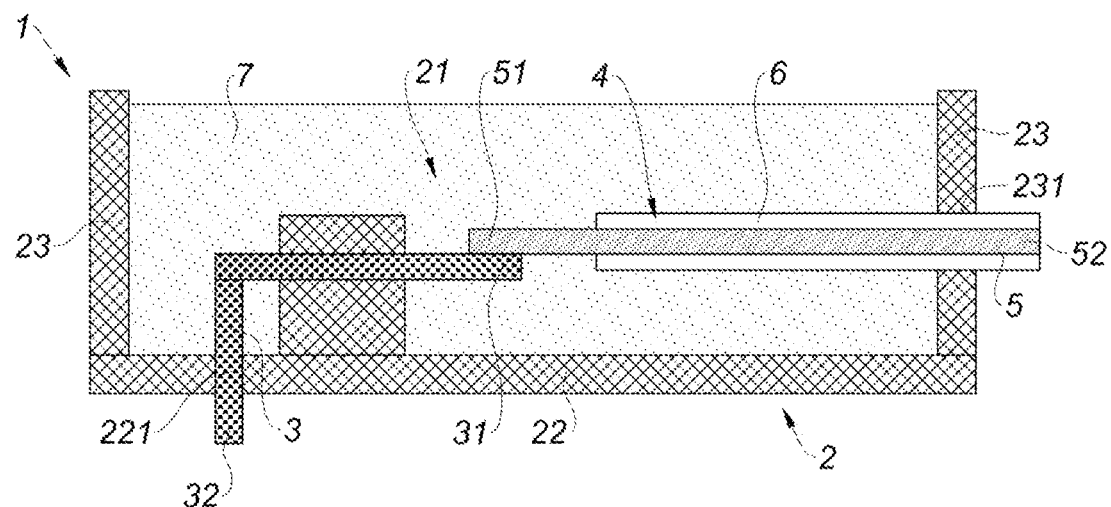
FIG. 1 is a schematic view of a connection device of the state of the art.

FIG. 1 represents a connection device 1 of the state of the art, this connection device 1 including a connection case 2 having an interior space 21 delimited by a bottom 22 and two side walls 23.

In this interior space 21 are arranged a conductive tab 3 and an electric wire 4, the conductive tab 3 passing through the bottom 22 through an orifice 221 and the electric wire 4 passing through one of the side walls 23 through an orifice 231.

The electric wire 4 is formed of a conductive core 5, consisting of several copper strands (not represented), surrounded by an insulating sheath 6, made of an electrically insulating material, so that this conductive core 5 has a stripped end 51, arranged in the interior space 21 of the connection case and located outside the insulating sheath 6, and one end 52, located in the insulating sheath and outside the interior space 21 of the connection case.

This stripped end 51 is also in contact with a first end 31 of the conductive tab 3.

For example, the stripped end 51 is crimped or welded to first end 31.

Thanks to setting the stripped end 51 in contact with the first end 31, the connection device 1 makes it possible to make an electrical connection between the end 52 of the conductive core 5, located outside the interior space 21 of the connection case 2, and a second end 32 of the conductive tab 3, also located outside the interior space 21 of the connection case 2.

By linking the end 52 to a first electric unit (not represented) and the second end 32 to a second electric unit (also not represented), the connection device 1 thus makes it possible to electrically connect this first electric unit and this second electric unit.

For example, the first electric unit may consist of an electric assist motor or a torque sensor used in an assist system of a motor vehicle and the second electric unit of an electronic board adapted to pilot this same electric assist motor or torque sensor.

Moreover, the interior space 21 of the connection case 2 is at least partially filled with a sealing material 7, so that the portions of the conductive tab 3, of the stripped end 51 and of the insulating sheath 6 arranged in this interior space 21 are completely immersed in the sealing material 7.

In particular, the stripped end 51 and the first end 31 are covered by the sealing material 7.

For example, the sealing material 7 may be a resin type material.

The role of the sealing material 7 is to guarantee the sealing of the electrical connection between the end 52 and the second end 32.

In order to guarantee this sealing, the various elements of the connection device 1 are integral with each other and mechanically linked together.

Figure 2:
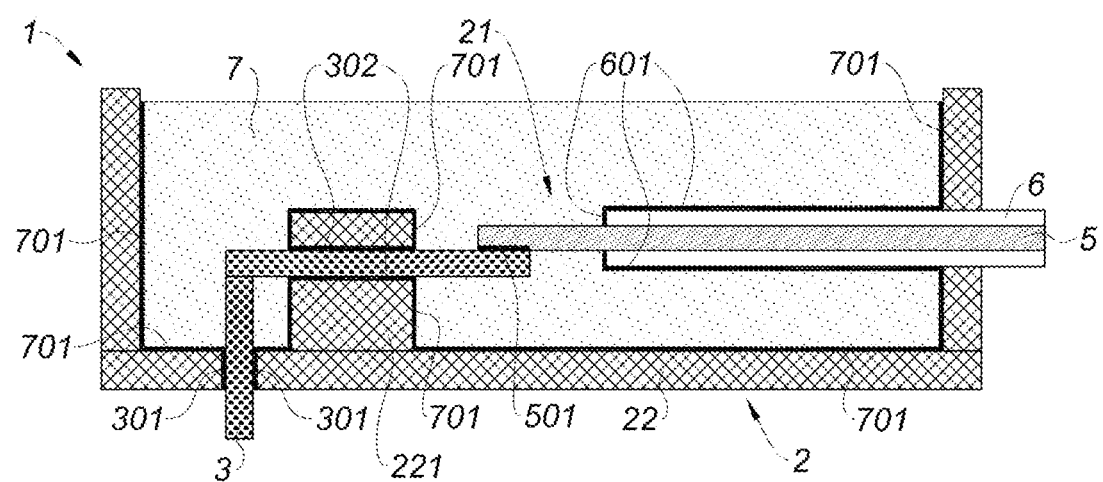
FIG. 2 is a schematic view of the mechanical linkages of the elements of a connection device of the state of the art.

FIG. 2 shows, in thickened lines, the contact surfaces between two elements which are secured and fastened to each other.

In particular, the conductive tab 3 is directly overmolded into the connection case 2 and is thus fastened to the bottom 22 (at the level of contact surfaces which are referenced 301) and to a support 221 (at the level of contact surfaces 302) formed from the material with this same bottom 23.

Similarly, the conductive core 5 is fastened, for example by crimping or welding, to the conductive tab 3 at the level of a contact surface 501.

Finally, the sealing material 7 is fastened by bonding to the bottom 22, to the support 221 and to the side walls 23 (at the level of contact surfaces 701) as well as to the insulating sheath 6 (at the level of contact surfaces 601).

However, it will be noted that the conductive core 5 is not fastened to the insulating sheath 6.

These various elements being fastened to each other, any displacement or deformation of one of them may cause displacement and/or deformation of the other element(s) to which it is fastened.

Figure 3:
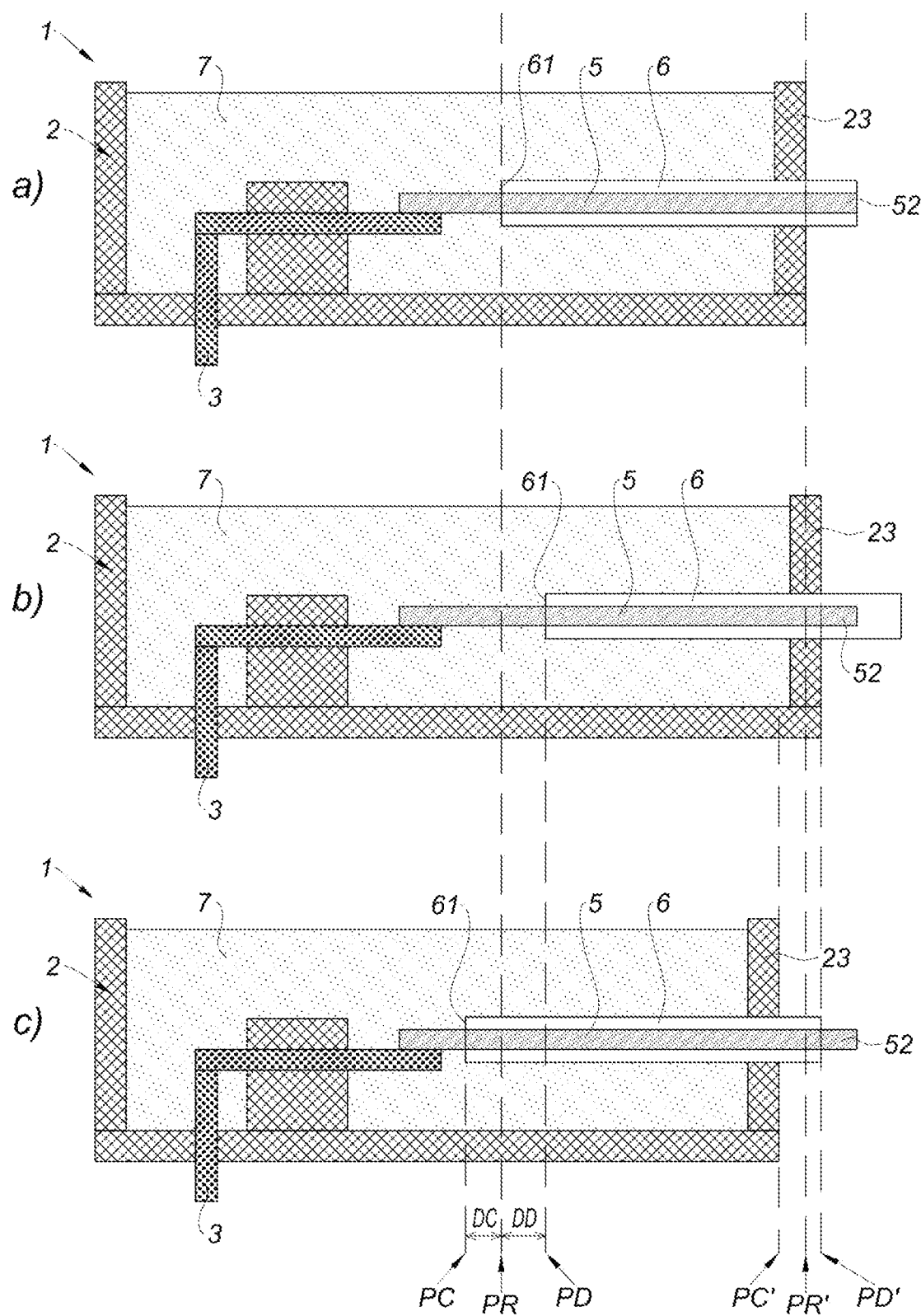
FIG. 3 is a schematic representation of the pumping effect.

These mechanical linkages between the various elements thus making it possible to guarantee the sealing of the connection device 1 but have the drawback of promoting the appearance of a «pumping» phenomenon caused by temperature variations, as illustrated by FIG. 3.

FIG. 3a represents a connection device 1 in a reference configuration, in which this connection device 1 is subjected to a reference temperature: one end 61 of the insulating sheath 6 is then placed at a reference position PR and a side wall 23 is placed at a reference position PR'.

FIG. 3b represents this same connection device 1 when the latter is subjected to a temperature higher than the reference temperature.

During this temperature increase, all the elements of the connection device 1 undergo a thermal expansion, the intensity of which depends on the coefficient of thermal expansion of the material of which each of them was made: the higher the coefficient of thermal expansion of one of these elements, the more this one will undergo a significant deformation following the increase in temperature.

However, in the usual temperature and pressure ranges, the sealing material 7 usually has a thermal expansion coefficient much greater than that of the conductive core 5 (often made of copper) and of the insulating sheath 6.

Consequently: a temperature increase causes a strong deformation of the sealing material 7 but a very weak, often negligible, deformation of the conductive core 5 and of the insulating sheath 6.

Thus, as can be seen in FIG. 3b, following a temperature increase, the sealing material has greatly expanded: under the effect of this expansion, the connection case 2 has been deformed, the side wall 23 being now placed in a expansion position PD'.

In addition, the sealing material 7 being fastened on the insulating sheath 6, the expansion of this sealing material 7 has caused a displacement of this insulating sheath 6, the end 61 of which is now placed in an expansion position PD: the temperature increase is therefore reflected by a displacement DD of the insulating sheath 6 with respect to the conductive core 5, in the direction of the side wall 23.

Similarly, FIG. 3c represents the same connection device 1 when the latter is subjected to a temperature lower than the reference temperature.

Following this drop in temperature, the sealing material is strongly contracted: under the effect of this contraction the connection case 2 was deformed, the side wall 23 now being placed in a contraction position PC'.

The contraction of the sealing material 7 has also caused a displacement of the insulating sheath 6, the end 61 of which is now placed in a contraction position PC: the drop in temperature has therefore resulted in a displacement DC of the insulating sheath 6 with respect to the conductive core 5, in the direction of the conductive tab 3.

Thus, subjecting the connection device 1 to significant temperature variations (for example, of the order of a few tens of degrees Celsius) causes relative movements of the insulating sheath with respect to the conductive core 5, this conductive core 5 being alternately output then re-entered into this insulating sheath 6.

Figure 4:
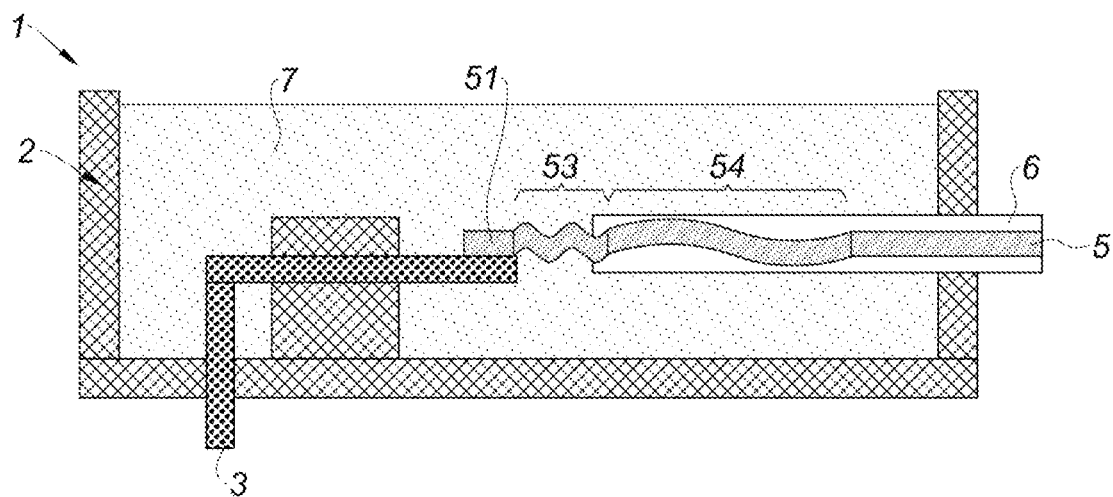
FIG. 4 is a schematic view of the consequences of the pumping effect.

When there is a misalignment between the conductive core 5 and the insulating sheath 6 (for example, related to uncertainties and inaccuracies in the manufacture and assembly of the electric wire 4 and/or the connection device 1), this reciprocating movement of the insulating sheath 6 with respect to the conductive core may cause twisting of the strands constituting the conductive core 5, as illustrated by FIG. 4.

Indeed, due to this misalignment, it may become difficult to introduce the conductive core 5 into the insulating sheath 6 following a drop in temperature (resulting in a contraction of the sealing material 7): the strands constituting the conductive core 5 are thus «crushed» against the end 61 of the insulating sheath 6 and may undergo significant deformations.

For example, in FIG. 4, the conductive core 5 has undergone a strong deformation in a portion 53 located against the end 61 of the insulating sheath and outside the latter, and a deformation of lower intensity in a portion 54 located inside the insulating sheath 6.

These deformations of the conductive core 5 following the pumping phenomenon may, over time, cause fatigue or rupture of the material composing it, leading to a (partial or total) degradation of the quality of the electrical connection made by means of the connection device 1.

Figure 5:
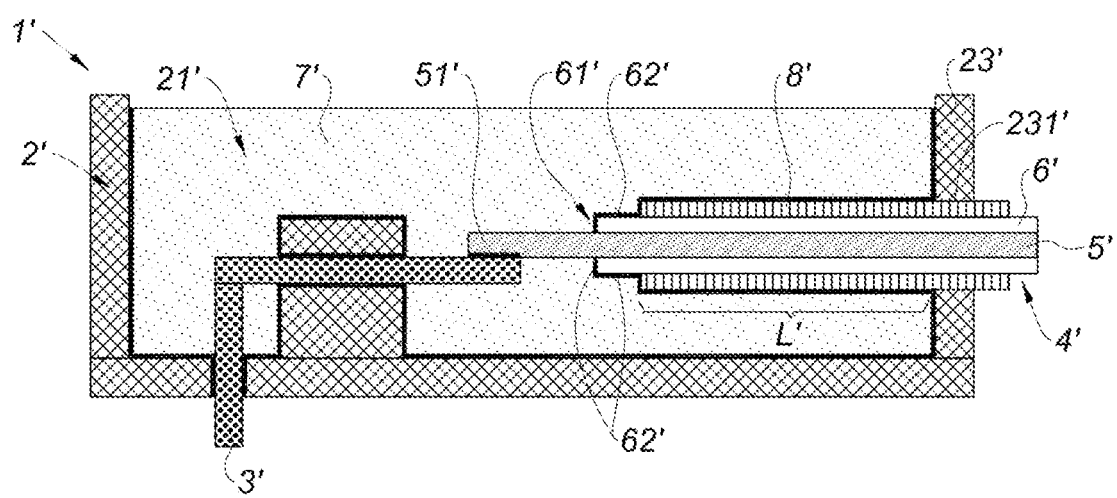
FIG. 5 is a schematic view of a connection device according to the invention.

FIG. 5 represents a connection device 1' according to a particular embodiment of the invention, making it possible to limit the damage to the conductive core 5 undergone following temperature variations.

This connection device 1' is identical to the connection device 1 (thus having a connection case 2", a conductive tab 3", a conductive core 5' and an insulating sheath 6', etc.) but includes in addition to this latter an intermediate envelope 8'.

This intermediate envelope 8' is slidably mounted around the insulating sheath 6' and bonded to the sealing material 7': thus it constitutes an interface between this same insulating sheath 6' and the sealing material 7'.

Although the intermediate envelope 8' is not mechanically coupled to the insulating sheath 6', it may be advantageous to choose for the production of this intermediate envelope 8' a material having a low coefficient of thermal expansion, in particular a coefficient of thermal expansion lower than that of the sealing material 7' and similar to that of the insulating sheath 6", in order to limit the intensity of the deformations undergone by this intermediate envelope in the event of temperature variations.

This intermediate envelope 8' may also be made of a foam-like material.

The intermediate envelope 8' is formed of a single section extending from the orifice 231', through which the insulating sheath 6' and the conductive core 5' are introduced into the connection case 2', up to the proximity of the end 61' of the insulating sheath 6': in this way, the insulating sheath 6' is no longer in contact with the sealing material 7' except on a reduced contact surface 62', located close to the end 61'.

This contact surface 62' is much smaller in size than that of the contact surface 601 between the sealing material 7 and the insulating sheath 6 of the connection device 1 of the state of the art.

It will be noted that the intermediate envelope 8' is not bonded to the connection case 2', although it passes through the side wall 23'.

The presence of the intermediate envelope 8' does not compromise the sealing of the connection device 1' because the sealing material 7' remains bonded to the insulating sheath 6' at the level of the contact surface 62'.

On the other hand, the presence of the intermediate envelope 8' makes it possible to greatly reduce the intensity of the pumping phenomenon, in the event of temperature variations.

Indeed, when the sealing material 7' undergoes an expansion or a contraction respectively following a rise or a drop in temperatures (as previously described), this expansion or this contraction is transmitted to the intermediate envelope 8', because it is mechanically linked to the sealing material 7': a deformation of the sealing material 7' along the intermediate envelope 8' leads therefore to deformations of the latter.

However, since the insulating sheath 6' is not mechanically linked to the intermediate envelope 8', the expansion or the contraction of the sealing material 7' is not transmitted to the insulating sheath 6' and ultimately does not cause any relative displacement of this insulating sheath 6' with respect to the conductive core 5', as was the case for the connection device described by the preceding FIGS. 1 to 4.

Thus, the presence of the intermediate envelope 8' makes it possible to mechanically separate the insulating sheath 6' from the sealing material 7' and to protect this insulating sheath 6' from the expansions or the contractions of the latter over the entire length of the intermediate envelope 8'.

The insulating sheath 6' undergoes therefore the effects of the expansions or the contractions of the sealing material 7' only at the level of the reduced contact surface 62': the relative movement of the insulating sheath 6' with respect to the conductive core 5' caused by temperature variations thus has a much lower amplitude, due to the small size of this reduced contact surface 62' compared to the size of the previous contact surface 601.

The addition of the intermediate envelope 8' around the insulating sheath 6' makes it possible to therefore limit the risk of twisting and/or rupture of the strands constituting the conductive core 5' following repeated temperature changes, thus reducing the risk of degradation of the quality of the electrical connection made by the connection device 1' between two electric units.

Another embodiment, which is not represented, may also be considered, in which the intermediate envelope 8' is bonded to the insulating sheath 6' and in sliding contact with the sealing material 7'.

In the same way as previously described, the presence of the intermediate envelope 8' makes it possible to separate the insulating sheath 6' from the sealing material 7' and thus to avoid any pumping effect.

It will also be noted that, in other embodiments which are not represented, other shapes and positions of the intermediate envelope 8' may be considered: it remains however necessary that the residual contact surface between the insulating sheath 6' and the sealing material 7' is small and located close to the conductive tab 3', in order to limit the effects of the pumping phenomenon.

For example, and in a non-limiting manner, it may be ensured that the length L' of the intermediate envelope 8', measured from the side wall 23', is as long as possible.

The invention claimed is:

1. A connection device adapted to electrically connect, in a sealed manner, a first electric unit and a second electric unit, the connection device including a connection case defining an interior space in which are arranged:
    at least one electric wire, adapted to be linked to the first electric unit and including a conductive core encircled by an insulating sheath up to a stripped end of the conductive core, and
    a conductive tab, adapted to be linked to the second electric unit and mechanically secured to the stripped end of the conductive core, so as to make an electrical contact between the conductive tab and the conductive core,
    the conductive tab, the stripped end and the insulating sheath being immersed in a sealing material filling the interior space of the connection case and ensuring the sealing of the electrical connection between the conductive tab and the stripped end, the sealing material being bonded to the insulating sheath and to the connection case,
    wherein the connection device includes an intermediate envelope partially coating the insulating sheath, so that the insulating sheath is in contact with the sealing material only over a reduced portion of the insulating sheath, where the intermediate envelope is in sliding contact with the sealing material and/or with the insulating sheath.

2. The connection device according to claim 1, wherein the sealing material is bonded to the intermediate envelope, the intermediate envelope being slidably mounted on the insulating sheath.

3. The connection device according to claim 1, wherein the intermediate envelope is bonded to the insulating sheath and is in sliding contact with the sealing material.

4. The connection device according to claim 1, wherein the intermediate envelope and the insulating sheath are each made of a different material.

5. The connection device according to claim 1, wherein the intermediate envelope is made of a material having a coefficient of thermal expansion lower than that of the sealing material.

6. The connection device according to claim 1, wherein the intermediate envelope is formed of a foam-like material.

7. The connection device according to claim 1, wherein the electric wire enters the interior space through an orifice formed in a side wall of the connection case, the conductive core, the insulating sheath and the intermediate envelope passing through the side wall through the orifice.

8. The connection device according to claim 7, wherein the intermediate envelope consists of only a single section extending from the side wall of the connection case.

9. The connection device according to claim 1, wherein the conductive core of the electric wire is formed by at least two separate copper strands.

10. A control system of a motor vehicle, the control system including:
    a connection device in accordance with claim 1.

* * * * *